United States Patent
Zanchi et al.

(10) Patent No.: US 11,594,965 B2
(45) Date of Patent: Feb. 28, 2023

(54) POWER CONVERTER COUNTER CIRCUIT WITH UNDER-REGULATION DETECTOR

(71) Applicant: pSemi Corporation, San Diego, CA (US)

(72) Inventors: Brian Zanchi, Dracut, MA (US); Gregory Szczeszynski, Hollis, NH (US); Aichen Low, Cambridge, MA (US); Chak Sang Ngai, Campbell, CA (US)

(73) Assignee: pSemi Corporation, San Diego, CA (US)

( * ) Notice: Subject to any disclaimer, the term of this patent is extended or adjusted under 35 U.S.C. 154(b) by 104 days.

(21) Appl. No.: 17/121,426

(22) Filed: Dec. 14, 2020

(65) Prior Publication Data
US 2022/0190719 A1    Jun. 16, 2022

(51) Int. Cl.
*H02M 3/158*    (2006.01)
*G01R 19/165*    (2006.01)
(Continued)

(52) U.S. Cl.
CPC ...... *H02M 3/158* (2013.01); *G01R 19/16538* (2013.01); *H03K 5/24* (2013.01); *H02M 1/0012* (2021.05); *H02M 1/0025* (2021.05)

(58) Field of Classification Search
None
See application file for complete search history.

(56) References Cited

U.S. PATENT DOCUMENTS

| 5,903,449 A | 5/1999 | Garrigan et al. |
| 7,034,508 B1 * | 4/2006 | Sasaki ............... H02P 9/305 |
| | | 322/17 |

(Continued)

FOREIGN PATENT DOCUMENTS

EP    3657182    5/2020

OTHER PUBLICATIONS

Park, Hye Lyun, International Search Report and Written Opinion received from KIPO dated Feb. 28, 2022 for appln. No. PCT/US2021/058455, 8 pgs.

(Continued)

*Primary Examiner* — Jeffrey A Gblende
(74) *Attorney, Agent, or Firm* — Jaquez Land Greenhaus & McFarland LLP; John Land, Esq.

(57) ABSTRACT

Circuits and methods for reducing lagging responses of a power converter to changes in circuit voltages or current, over-shoot/under-shoot when a target output voltage changes faster than the power converter's response, and open loop conditions. Embodiments include scanning a feedback voltage from a load powered by a voltage output by a power converter controlled by a PWM control signal; detecting an under-regulation condition; and, while the under-regulation condition is detected, increasing a clock signal rate to a counter outputting a count value usable to generate the PWM control signal. Embodiments include comparing a target output voltage to a signal representative of an output voltage of the power converter; indicating an under-shoot or over-shoot condition if the voltage difference exceeds a corresponding offset value; and limiting the range (Continued)

of values for an M-bit count value used to generate the PWM control signal to mitigate the under-shoot or over-shoot condition.

20 Claims, 13 Drawing Sheets

(51) Int. Cl.
   *H03K 5/24* (2006.01)
   *H02M 1/00* (2006.01)

(56) References Cited

U.S. PATENT DOCUMENTS

| | | | |
|---|---|---|---|
| 9,160,165 B2 * | 10/2015 | Cortigiani | ............... H02H 9/02 |
| 9,190,906 B2 * | 11/2015 | Henzler | ............... H02M 3/157 |
| 9,772,639 B2 * | 9/2017 | Farber | ............... G05F 1/575 |
| 10,716,184 B1 * | 7/2020 | Pu | ............... H05B 45/375 |
| 2004/0052095 A1 | 3/2004 | Muegge et al. | |
| 2005/0212498 A1 | 9/2005 | Kubota et al. | |
| 2008/0024100 A1 | 1/2008 | Huang et al. | |
| 2019/0271998 A1 | 9/2019 | Sisson et al. | |
| 2021/0050718 A1 * | 2/2021 | Djelassi-Tscheck | ... H02H 5/044 |
| 2022/0149732 A1 | 5/2022 | Zanchi et al. | |

OTHER PUBLICATIONS

Ioannidis, et al., "A mixed-mode PWM controller", International Journal of Electronics, vol. 97, No. 12, Dec. 2010, pp. 1423-1438.
Zanchi, et al., "Mixed-Mode Power Converter Control", U.S. Appl. No. 17/096,820, filed Nov. 12, 2020, 36 pgs.
Kazimierczuk, Marian K., "Pulse-Width Modulated DC-DC Power Converters, 2nd Ed." 2016 John Wiley & Sons, 68 pgs.
Lynch, Brian T., "Under the Hood of a DC/DC Boost Converter", TI Power Supply Design Seminar, vol. 2009, 2008, 26 pgs.
Sheehan, Robert, "Understanding and Applying Current-Mode Control Theory", Principal Applications Engineer National Semiconductor Corporation, Santa Clara, CA, PES07, Oct. 31, 2007, 30 pgs.
Sipex, "Voltage Mode Control: The Modulator in Continuous Current Mode (CCM) of Operation", Application Note ANP 15, Dec. 18, 2006, 10 pgs.
PSemi Corporation, Preliminary Amendment filed in the USPTO dated Jan. 22, 2021 for U.S. Appl. No. 17/096,820, 5 pgs.
Tran, Nguyen, Final Office Action received from the USPTO dated Oct. 6, 2022 for U.S. Appl. No. 17/096,820, 24 pgs.

* cited by examiner

POWER CONVERTER COUNTER CIRCUIT WITH UNDER-REGULATION DETECTOR

CROSS-REFERENCE TO RELATED APPLICATIONS

This invention may be related to the following patent application, assigned to the assignee of the present invention, the contents of which are incorporated by reference: U.S. patent application Ser. No. 17/096,820, filed Nov. 12, 2020, entitled "Mixed-Mode Power Converter Control".

BACKGROUND

(1) Technical Field

This invention relates to electronic circuits, and more particularly to control systems for power converter circuits.

(2) Background

Many electronic products, particularly mobile computing and/or communication products and components (e.g., notebook computers, ultra-book computers, tablet devices, LCD and LED displays) require multiple voltage levels. For example, a cellular telephone may utilize LCD displays backlit by LEDs, both of which may require different voltage levels than the radio frequency transceivers in the cellphone, and all of those voltage levels may differ from the voltage directly supplied by the battery of the cellphone.

In modern electronic systems requiring unique voltage rails, there has been a trend towards using a single-voltage, intermediate-bus architecture rather than a centralized, multi-voltage source. Localized "point-of-load" DC-to-DC power converters may then be optimized for specific loads. DC-to-DC power converters generate a lower or higher voltage from a common power source, such as a battery. Power converters which generate a lower output voltage (e.g., $V_{OUT}$) level from a higher input voltage (e.g., $V_{IN}$) power source are commonly known as step-down or buck converters, so-called because $V_{OUT}<V_{IN}$, and hence the converter is "bucking" the input voltage. Power converters which generate a higher output voltage level from a lower input voltage power source are commonly known as step-up or boost converters, because $V_{OUT}>V_{IN}$. An AC-DC power converter can be built up from a DC-DC power converter by, for example, first rectifying an AC input to a DC voltage and then applying the DC voltage to a DC-DC power converter.

FIG. 1 is a block diagram showing a prior art DC-to-DC power converter 100. In the illustrated example, the power converter 100 includes a DC-to-DC converter circuit 102 and a controller 104. The DC-to-DC converter circuit 102 is configured to receive a DC input voltage $V_{IN}$ from a voltage source 106 (e.g., a battery) across terminals V1+, V1−, and transform the input voltage $V_{IN}$ into a DC output voltage $V_{OUT}$ across terminals V2+, V2−. The output voltage $V_{OUT}$ is shown coupled across a load $R_{LOAD}$.

The controller 104 receives a set of input signals and produces a set of output signals. Some of these input signals arrive along a signal path 110 connected to the DC-to-DC converter circuit 102. These input signals carry information that is indicative of the operational state of the converter circuit 102. The controller 104 typically also receives at least a clock signal CLK and one or more external input/output (I/O) signals that may be analog, digital, or a combination of both. Based upon the received input signals, the controller 104 produces a set of control signals back to the converter circuit 102 on the signal path 110 that control the internal components of the DC-to-DC converter circuit 102 (e.g., internal switches, such as low voltage FETs, especially MOSFETs) to cause the converter circuit 102 to boost or buck $V_{IN}$ to $V_{OUT}$. In some embodiments, an auxiliary circuit (not shown) may provide various signals to the controller 104 (and optionally directly to the DC-to-DC converter circuit 102), such as the clock signal CLK, the I/O signals, as well as various voltages, such as one or more reference voltages $V_{REF}$ and/or bias voltages $V_{BIAS}$.

Although shown as separate blocks, the DC-to-DC converter circuit 102 and the controller 104 may be integrated together, in whole or in part, on one integrated circuit (IC). In addition, the DC-to-DC converter circuit 102 and/or the controller 104 may include one or more external components, such as inductors or capacitors, as needed for a particular application.

One type of DC-to-DC power converter is based on a fixed-frequency switched inductor-capacitor circuit controlled by a pulse-width modulation (PWM) closed-loop controller. For example, FIG. 2 is a schematic diagram of one prior art switched inductor-capacitor DC-to-DC power converter circuit 200. In the illustrated example, two switches M1, M2 are series-coupled between an input voltage $V_{IN}$ and circuit ground. An energy-storage inductor L is coupled to a node N1 between the switches M1, M2 and to a node N2, which presents an output voltage $V_{OUT}$. A filter capacitor C is coupled between the node N2 and circuit ground. A resistor $R_{LOAD}$ represents a DC load between node N2 and circuit ground. The L-C-$R_{LOAD}$ subcircuit functions like a second-order low-pass filter to smooth voltage variations present at node N1.

The switches M1, M2 are depicted in FIG. 2 as field-effect transistors, such as MOSFETs. However, other power switches such as bipolar junction transistors (BJTs), isolated gate bipolar transistors (IGBTs), or MOS-controlled thyristors (MCTs) may also be used. In some embodiments, switch M2 may be implemented as one or more series-coupled diodes.

The function of the inductor L and the filter capacitor C is energy transfer and storage. A PWM duty cycle controller 202 coupled to control inputs of the switches M1, M2 (e.g., the gates of MOSFETs) selectively enables (turns "ON") or disables (turns "OFF") the switches M1, M2 by means of a PWM-CTRL and/PWM_CTRL signals (/PWM_CTRL is generally the inverse of PWM-CTRL, but in certain modes, such as a discontinuous conduction mode or a shutdown mode, both switches M1, M2 are turned OFF). Accordingly, switches M1 and M2 form a multi-state switch which controls the energy flow from the source to the load. The PWM duty cycle controller 202 receives $V_{OUT}$ as a feedback voltage (e.g., from node N2) and generally receives a fixed-frequency clock signal CLK or internally generates such a clock signal. The feedback voltage enables the PWM duty cycle controller 202 to vary the duty cycle of the PWM-CTRL signal to offset changes in the load resistance $R_{LOAD}$ and/or the input voltage $V_{IN}$, or changes in the load current $I_{OUT}$, thereby regulating $V_{OUT}$. The PWM duty cycle controller 202 may be part of the controller 104 of FIG. 1 or may be a stand-alone circuit. Note that additional components, such as level shifters and/or driver circuits, may be needed between the PWM duty cycle controller 202 and the control inputs of the switches M1, M2 in some embodiments.

FIG. 3 is a schematic diagram of one prior art PWM duty cycle controller 300 which may be used in the circuit of FIG. 2. The output voltage $V_{OUT}$ is applied, either directly or as translated to a lower reference point by a scaling circuit 302, to a first input of an error amplifier 304 as a feedback voltage, $V_{OUT\_FB}$. In the illustrated example, the scaling circuit 302 is a resistive divider comprising two resistors Ra, Rb coupled in series between $V_{OUT}$ and circuit ground, and provides a scaled output, $V_{OUT\_FB}$ to the error amplifier 304. The resistors Ra, Rb are shown as variable or settable, but may be fixed in value. Scaling of $V_{OUT}$ to $V_{OUT\_FB}$ may be accomplished by other known circuits.

A second input of the error amplifier 304 is shown coupled to a digital-to-analog converter (DAC) 306 that sets a target voltage, $V_{OUT\_TARGET}$, for the output of a connected DC-to-DC converter circuit 102. In the illustrated example, the DAC 306 is coupled to a counter (see FIG. 5), which alters $V_{OUT\_TARGET}$ up or down in value in response to a controlling signal, such as $V_{OUT}$, in order to change the regulated output voltage of a connected DC-to-DC converter circuit 102. As the requirements for a desired $V_{OUT}$ change, the count input to the DAC 306 will increment or decrement, thereby causing a corresponding change in $V_{OUT\_TARGET}$. In other words, there is circuitry (not shown in FIG. 3) that generates a count as a (direct or indirect) function of $V_{OUT}$ that decides if $V_{OUT\_TARGET}$ is set correctly. If $V_{OUT\_TARGET}$ is set correctly, is the counter will be held. If $V_{OUT\_TARGET}$ is not set correctly, then the counter will increment or decrement. In alternative embodiments, other circuits may be used to set the target voltage for the DC-DC converter output.

The error amplifier 304 integrates the error between $V_{OUT\_TARGET}$ and $V_{OUT\_FB}$, outputting a comparison signal COMP at node X The output of the error amplifier 304 may be coupled to a compensation circuit 308 configured to stabilize the closed-loop response of the PWM duty cycle controller 300. In the illustrated example, the compensation circuit 308 includes a first capacitor C1 coupled between a control voltage $V_1$ and node X, and a series-coupled second capacitor C2 and resistor R1 coupled between a control voltage $V_2$ and node X. In general, $V_1$ and $V_2$ are dependent on the controller topology and can be nodes such as $V_{DD}$ (i.e., a voltage rail for the system low voltage internal circuitry), $V_{IN}$, and/or $V_{OUT}$, for example. Other compensation circuits 308 may be used in some embodiments.

The COMP signal is coupled to a first input of an analog comparator 310. A second input of the analog comparator 310 is coupled to a voltage ramp generator 312, which may have $V_{IN}$ and $V_{OUT}$ feedforward adjustments, as is known in the art. The voltage ramp generator 312 is coupled to a fixed-frequency clock signal CLK and outputs a ramped voltage signal, $V_{RAMP}$, to the comparator 310. The comparator 310 compares $V_{RAMP}$ to the integrated error signal, COMP, and generates a pulse-width modulated PWM_CTRL control signal having a duty cycle that is a function of the comparison. The PWM_CTRL control signal is coupled to the switched inductor-capacitor DC-to-DC power converter circuit 200 of FIG. 2 to switch the ON-OFF state of the switches M1, M2.

As one example of the operational characteristics of a switched inductor-capacitor DC-to-DC power converter circuit 200 controlled by a PWM duty cycle controller 300, in practice, the DC input voltage $V_{IN}$ often varies over a specified range while the output voltage $V_{OUT}$ is designed to be held at a fixed value. If $V_{IN}$ increases for a specified load $R_{LOAD}$, the duty cycle of the PWM_CTRL control signal is reduced to keep $V_{OUT}$ essentially constant, and, conversely, if $V_{IN}$ is reduced, the duty cycle of the PWM_CTRL control signal is increased. Similarly, if the load current $I_{OUT}$ decreases, the duty cycle of the PWM_CTRL control signal is reduced, and if the load current $I_{OUT}$ increases, the duty cycle of the PWM_CTRL control signal is increased.

FIG. 4 is a block diagram 400 showing one prior art application that includes a switched inductor-capacitor DC-to-DC power converter 402, which may be of the type shown in FIG. 2. The power converter 402 is coupled between a battery 404 and an array 406 of light emitting diodes (LEDs). For this application, the switched inductor-capacitor DC-to-DC power converter 402 generally is a boost converter. In the illustrated example, multiple LEDs are shown in strings, and there are multiple strings (strings 1-N in this example, where N≥1). Each string of LEDs is coupled to a corresponding LED current sink in an array of current sinks 408. The LED array 406 may be used, for example, as backlighting for an LCD display, such as in a cellular telephone, laptop computer, computer monitor, or television.

For the illustrated application, the regulated output voltage $V_{OUT}$ is not fixed and changes based on desired brightness of the LED array 406. Feedback voltage signals LED_FB$_1$-LED_FB$_N$ are accordingly provided to a control circuit that directs the power converter 402 to increase, decrease, or hold the output voltage $V_{OUT}$. Ideally, the power converter 402 regulates $V_{OUT}$ to minimize LED current sink voltages while preventing dropout, meaning that the LEDs are dimmer than expected.

FIG. 5 is a schematic diagram of a part of a prior art power converter control circuit 500 for the application shown in FIG. 4. The feedback voltage signals LED_FB$_1$-LED_FB$_N$ from the circuit of FIG. 4 are selectively coupled through corresponding switches S$_1$-S$_N$, functioning as a multiplexor, to a first input of first and second analog comparators 502a, 502b having built-in hysteresis. First and second programmable reference voltage sources 504a, 504b are coupled to a respective second input of the comparators 502a, 502b. The programmable reference voltage sources 504a, 504b generate corresponding dynamic threshold voltages $V_{REF1}$ and $V_{REF2}$, the values of which depend on LED programmed current such that $V_{REF1} > V_{REF2}$. Accordingly, $V_{REF1}$ sets a high ("hi") threshold and $V_{REF2}$ sets a low ("lo") threshold for comparison against the feedback voltage signals LED_FB$_1$-LED_FB$_N$ in the comparators 502a, 502b.

The outputs of the comparators 502a, 502b are coupled to respective resettable latching circuits, such as set-reset (SR) flip-flops 506a, 506b, which are reset after each feedback voltage signal LED_FB$_1$-LED_FB$_N$ is compared. The "hi" flip-flop 506a is coupled to a down ("DN") input of an up/down counter 508, while the "lo" flip-flop 506B is coupled to an UP input of the up/down counter 508. The output of the up/down counter 508 is an M-bit count value that is coupled to a digital-to-analog converter (DAC) 510 that sets a target voltage, $V_{OUT\_TARGET}$, that determines the value of $V_{OUT}$ for a connected power converter 402, as described above. In alternative embodiments, the DAC 510 may output a current that is subsequently converted in known manner to the target voltage $V_{OUT\_TARGET}$. The up/down counter 508 includes an input, CLK, for a clock signal, and may have one or more miscellaneous inputs MISC, such as a reset signal, one or more pre-set values, etc., as is known in the art. Together, the first and second analog comparators 502a, 502b and the corresponding first and second flip-flops 506a, 506b comprise first and second detector circuits 503a, 503b.

If a feedback voltage signal LED_FB$_X$ is less than $V_{REF2}$, the corresponding flip-flop 506b is set (i.e., the Q output is "1") and thus sends an LED_LO signal to the UP input of the up/down counter 508. If a feedback voltage signal LED_FB$_X$ is greater than V$_{REF1}$, the corresponding flip-flop 506b is set and thus sends an LED_HI signal to the DN input of the up/down counter 508. Accordingly, V$_{REF1}$ and V$_{REF2}$ define a band of permissible voltages for each feedback voltage signal LED_FB$_X$ where V$_{OUT}$ is held steady (i.e., V$_{OUT\_TARGET}$ is neither increased or decreased). If a feedback voltage signal LED_FB$_X$ is outside the permissible band, then the up/down counter 508 output count causes V$_{OUT\_TARGET}$ to be adjusted up or down as necessary to change V$_{OUT}$ for the connected power converter 402 in a step-wise fashion until that feedback voltage signal LED_FB$_X$ returns to an "in band" state.

In a closed-loop control system for a switched inductor-capacitor DC-to-DC power converter 402, it is important to maintain stability and respond quickly to changes to V$_{IN}$, V$_{OUT}$, and/or I$_{OUT}$, while minimizing or eliminating both lagging responses of the power converter to such changes and over-shoot/under-shoot that may occur when the target output voltage changes faster than the power converter's response. Accordingly, the inventor has recognized that it would be useful improve such a controller in a variety of ways.

SUMMARY

The invention encompasses circuits and methods for minimizing or eliminating lagging responses of a switched inductor-capacitor DC-to-DC power converter to changes to V$_{IN}$, V$_{OUT}$, and/or I$_{OUT}$, over-shoot/under-shoot that may occur when the target output voltage changes faster than the power converter's response, and open loop conditions that may occur when V$_{OUT}$ cannot reach a desired target for extended periods of time.

One aspect of the invention includes circuit and methods for controlling a power converter controlled by a pulse-width modulation (PWM) control signal, including scanning at least one feedback voltage from a load powered by a voltage output by the power converter; detecting an under-regulation condition indicated by the at least one feedback voltage; and, while the under-regulation condition is detected, increasing a clock signal rate to a counter outputting a count value usable to generate the PWM control signal to the power converter.

Another aspect of the invention includes circuit and methods for controlling a power converter controlled by a pulse-width modulation (PWM) control signal, including comparing a target output voltage to a voltage representative of an output voltage of the power converter; indicating an under-shoot condition if the difference between the compared voltages exceeds a first offset value and indicating an over-shoot condition if the difference between the compared voltages exceeds a second offset value; and limiting the range of values for an M-bit count value used to generate the PWM control signal to mitigate an under-shoot condition if indicated or an over-shoot condition if indicated.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The invention encompasses circuits and methods for minimizing or eliminating both lagging responses of a switched inductor-capacitor DC-to-DC power converter to changes to V$_{IN}$, V$_{OUT}$, and/or I$_{OUT}$, and over-shoot/under-shoot that may occur when the target output voltage changes faster than the power converter's response.

Under-Regulation Control

Careful consideration of certain operational conditions of an LED array 406 has lead to the understanding that the occurrence of two sequential states can lead to LED flicker. The first state is steady-state over-regulation (V$_{OUT}$>V$_{OUT\_TARGET}$), which may occur under high V$_{IN}$/low V$_{OUT}$ conditions. For example, in one embodiment of a DC-to-DC power converter that includes a switched inductor-capacitor boost converter followed by a charge pump (CP), if V$_{IN}$ is about 15V and the CP boost factor is two, then the minimum output voltage would be 30V. However, if the desired output is about 28V, then the power converter will be in an over-regulated state until V$_{IN}$ reduces or the desired V$_{OUT}$ increases above 30V. When in steady-state over-regulation, the DAC 510 continues to count down but V$_{OUT}$ does not follow as quickly. The DAC 510 eventually stops counting down at a lower output count M. If The second state then occurs, which is that V$_{IN}$ drops from a high voltage to a lower voltage, $V_{OUT}$ can now regulate to a lower voltage and will drop to $V_{OUT\_TARGET}$, which may have decremented too low for a desired LED brightness. Accordingly, noticeable screen flicker may occur due to a resultant unexpected drop in LED current and a slow update rate for the DAC 510.

Figure 6:
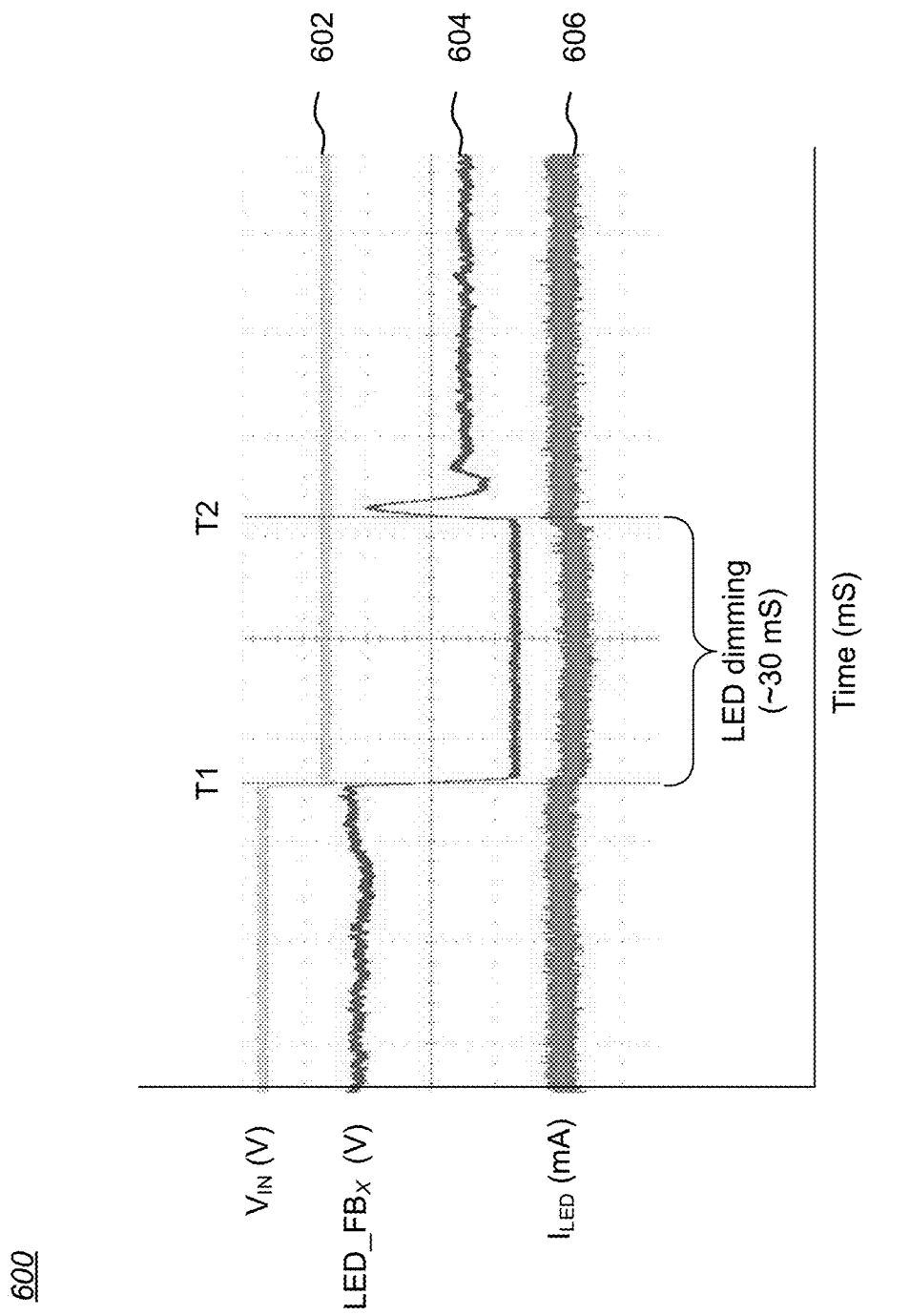
FIG. 6 is a set of graphs showing V$_{EV}$, the feedback voltage signal LED_FB$_X$ from an LED string, and the current I$_{LED}$ through the LED string, all versus time.

For example, FIG. 6 is a set of graphs 600 showing $V_{IN}$, the feedback voltage signal LED_FB$_X$ from an LED string, and the current $I_{LED}$ through the LED string, all versus time. Graph line 602 shows $V_{IN}$, initially at an elevated value, suddenly drops to a lower value at time T1, such as may occur when the power source to an LED display changes from AC to a battery (e.g., when a laptop computer is unplugged from a wall outlet). As a result, $V_{OUT}$ will drop and consequently the feedback voltage signal LED_FB$_X$ (which is a function of $V_{OUT}$) will abruptly drop at time T1 to an under-regulated value, as shown by graph line 604. Before the DAC 510 can correct $V_{OUT}$ by counting to a higher value by time T2 (about 30 mS later than time T1 in this example), the LED current $I_{LED}$ drops between times T1 and T2, as shown by graph line 606. The drop in the LED current $I_{LED}$ causes noticeable dimming, seen as a flicker due to the recovery of $V_{OUT}$ by time T2 when the DAC 510 has counted up sufficiently to raise $V_{OUT}$ to a level that supplies sufficient current to the LEDs.

Using a faster DAC 510 to correct for this situation can cause oscillations in the control loop, and is thus undesirable. Embodiments of the present invention provide a novel solution, which detects under-regulation of the feedback voltage signals LED_FB$_1$-LED_FB$_N$ and temporarily increases the clock rate to the up/down counter 508 to increment the output count M more quickly to the DAC 510, thus boosting $V_{OUT}$ more quickly and thereby essentially eliminating LED flicker (for example, reducing the interval from time T1 to time T2 in FIG. 6 to less than about 1-2 mS generally would not be perceived as flicker by the human eye).

Figure 4:
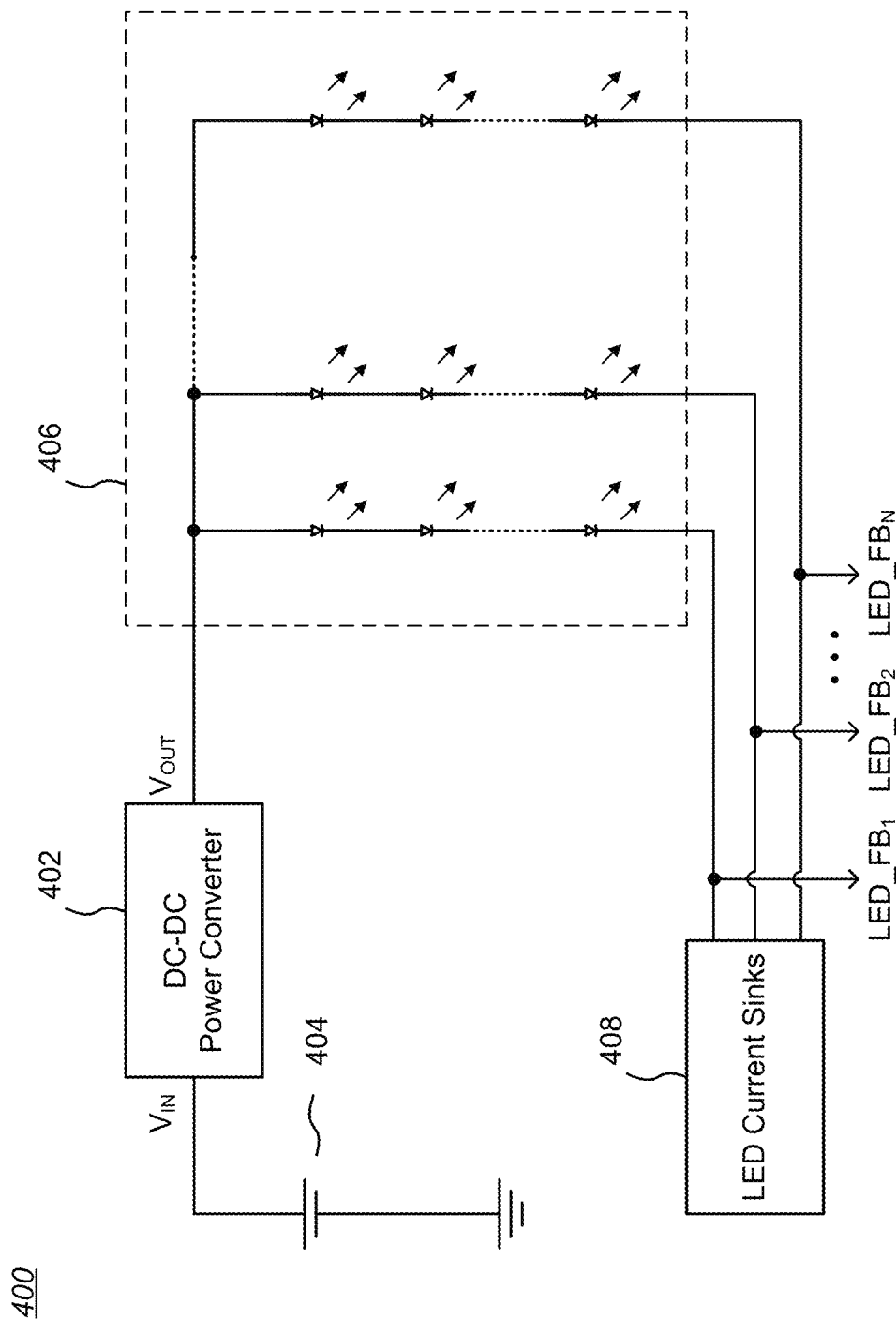
FIG. 4 is a block diagram showing one prior art application that includes a switched inductor-capacitor DC-to-DC power converter, which may be of the type shown in FIG. 2.
Figure 5:
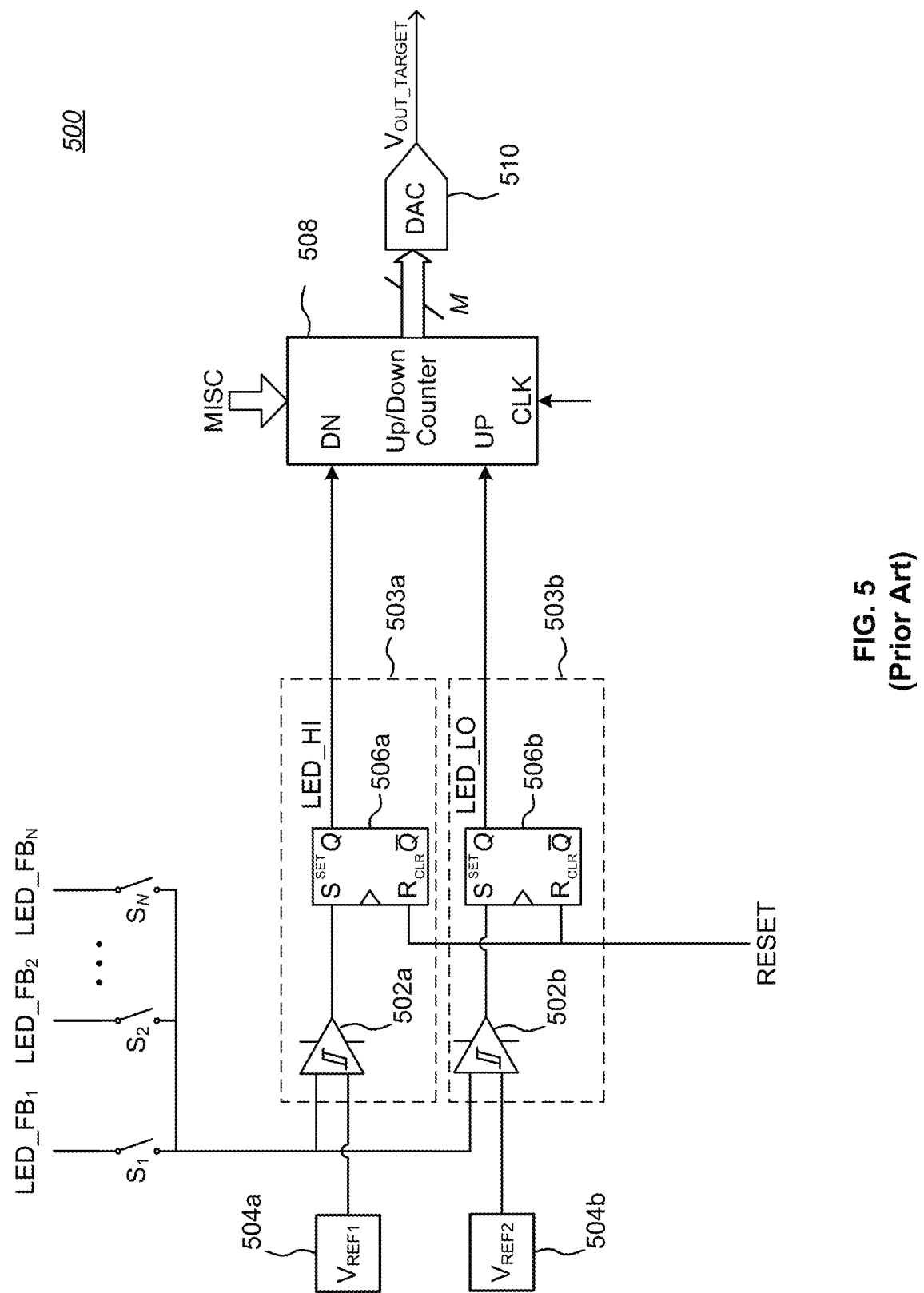
FIG. 5 is a schematic diagram of a part of a prior art power converter control circuit for the application shown in FIG. 4.
Figure 7:
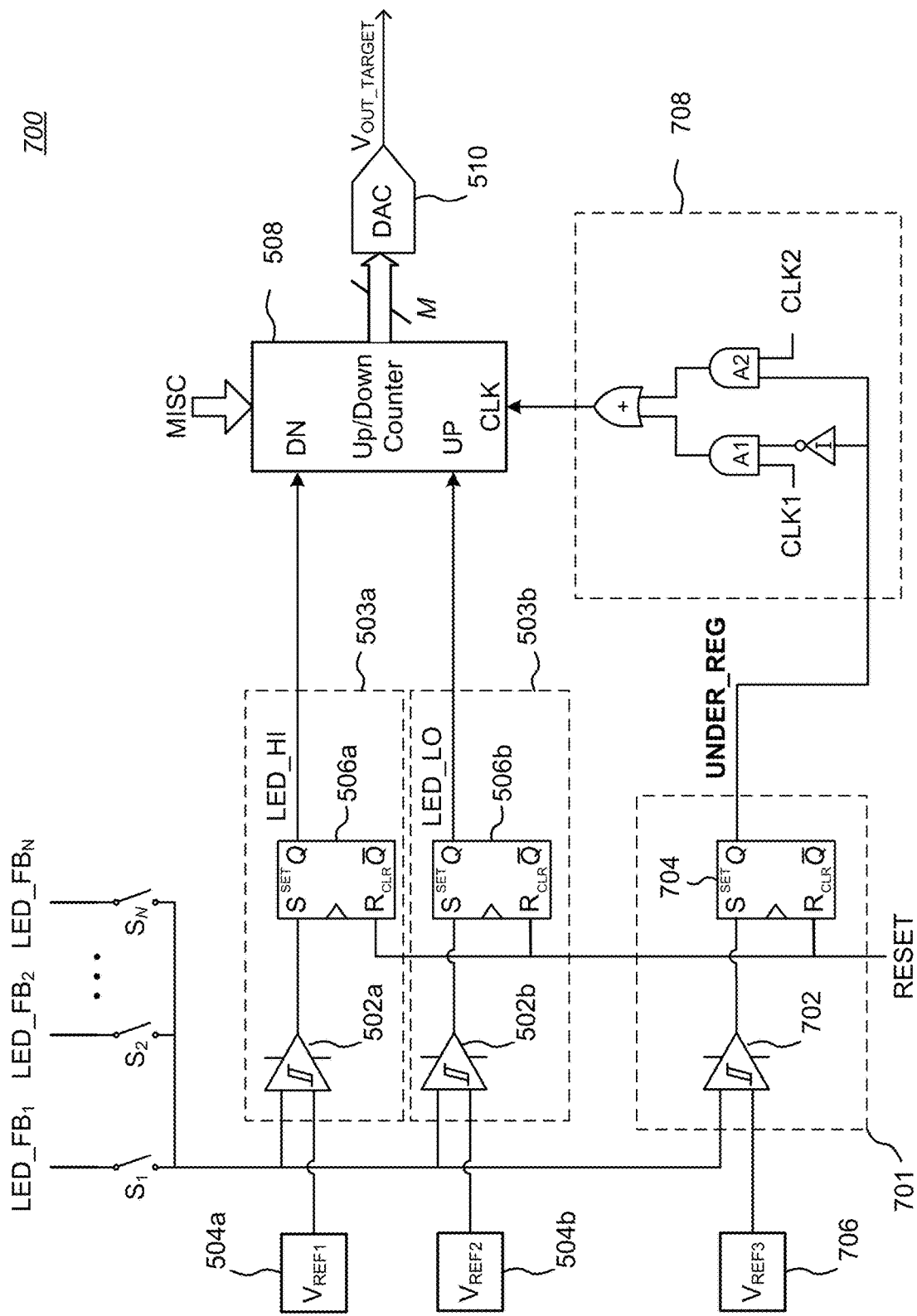
FIG. 7 is a schematic diagram of a part of an improved power converter control circuit in accordance with the present invention.

For example, FIG. 7 is a schematic diagram of a part of an improved power converter control circuit 700 in accordance with the present invention. The improved control circuit 700 may be used, for example, to control the DC-DC power converter 402 in FIG. 4. Similar in many aspects to the circuit shown in FIG. 5, the circuit illustrated in FIG. 7 includes additional components to realize a novel solution. More specifically, the feedback voltage signals LED_FB$_1$-LED_FB$_N$ from the circuit of FIG. 4 are also selectively coupled through corresponding switches S$_1$-S$_N$, functioning as a multiplexor, to an under-regulation detector circuit 701 comprising, in this example, an added analog comparator 702 having built-in hysteresis and an added resettable latching circuit, such as a set-reset (SR) flip-flop 704.

In greater detail, a feedback voltage signal LED_FB$_X$ is coupled to a first input of the added analog comparator 702. An added programmable reference voltage source 706 is coupled to a second input of the added comparator 702, and generates a dynamic under-regulation threshold voltage $V_{REF3}$, the value of which depends on LED programmed current and other factors, such as process/voltage/temperature (PVT) variations. The dynamic under-regulation voltage $V_{REF3}$ generally correlates to LED brightness (e.g., a higher LED current means a higher threshold value for $V_{REF3}$, and a lower LED current means a lower threshold value for $V_{REF3}$).

Notably, the relative values output by the reference voltage sources 504a, 504b, and 706 are such that $V_{REF1} > V_{REF2} > V_{REF3}$. Accordingly, $V_{REF3}$ sets a relatively low threshold, corresponding to an under-regulated voltage value, for comparison against the feedback voltage signals LED_FB$_1$-LED_FB$_N$ in the added comparator 702. The under-regulation threshold value for $V_{REF3}$ is preferably set such that the DAC 510 is always in an increment mode when an under-regulation condition exists, thus preventing fast decrementing which could lead to oscillations.

The output of the added comparator 702 is coupled to the added set-reset (SR) flip-flop 704, which is reset after each feedback voltage signal LED_FB$_1$-LED_FB$_N$ is Compared. If a feedback voltage signal LED_FB$_X$ is less than $V_{REF3}$, the added flip-flop 704 is set (i.e., the Q output is "1") and generates an UNDER_REG signal from the under-regulation detector circuit 701 indicating that an under-regulation condition exists for the corresponding LED. The under-regulation detector circuit 701 may be implemented in other circuitry without changing the functionality.

The UNDER_REG signal is coupled to a clock signal selector 708, which is essentially a multiplexer. In the illustrated example, the clock signal selector 708 comprises first and second AND gates A1, A2 having outputs coupled to an OR gate. The output of the OR gate is coupled to the clock input CLK of the up/down counter 508. The UNDER_REG signal is coupled indirectly to a first input of the first AND gate A1 after inversion by an intervening inverter I, and directly to a first input of the second AND gate A2. The first AND gate A1 has a second input coupled to a first clock signal CLK1, while the second AND gate A2 has a second input coupled to a second clock signal CLK2, the second clock signal CLK2 is at a higher frequency than the first clock signal CLK1. The second clock signal CLK2 may have, for example, a frequency 2-10 times higher than the frequency of the first clock signal CLK1, but even higher frequencies for the second clock signal CLK2 may be used in some embodiments.

When an under-regulation condition is absent, the UNDER_REG signal will be a "0", and the clock signal selector 708 will pass only the first clock signal CLK1 to the clock input CLK of the up/down counter 508. However, when an under-regulation condition occurs, the UNDER_REG signal will be a "1", and the clock signal selector 708 will pass only the second clock signal CLK2 to the clock input CLK of the up/down counter 508. As should be clear, the logic of the clock signal selector 708 may be incorporated into the up/down counter 508, which would then have at least two clock inputs, for the CLK1 and CLK2 clock signals.

In alternative embodiments, rather than switch clock speeds to the up/down counter 508, the UNDER_REG signal may cause a relatively high preset value to be loaded into the up/down counter 508 (e.g., through the MISC input), thereby setting the up/down counter 508 to a higher value of the output count M than existed when the under-regulation event occurred. The higher preset value, which results in a higher value of $V_{OUT\_TARGET}$ from the DAC 510, will thus drive $V_{OUT}$ more quickly to a sufficiently high value to mitigate the under-regulation event. The higher preset value for M may be just to a high pre-determined code, or may be algorithmically or heuristically determined (for example, based on a known number of LEDs in a string and the present current draw) and dynamically computed or stored in a look-up table.

Figure 8:
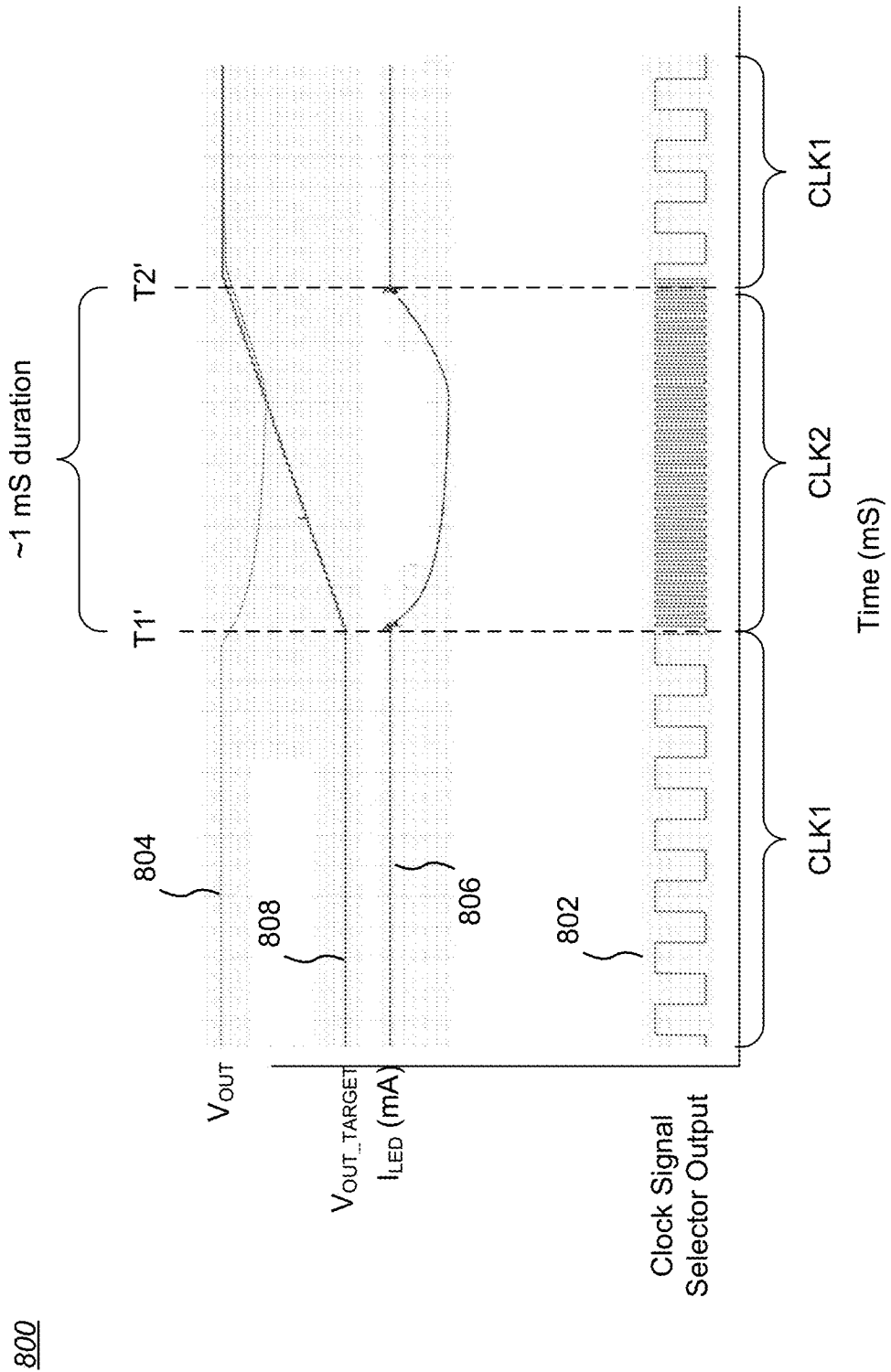
FIG. 8 is a set of graphs showing V$_{OUT}$, V$_{OUT\_TARGET}$, the current I$_{LED}$ through an LED string, and the output of the clock signal selector, all versus time.

FIG. 8 is a set of graphs 800 showing $V_{OUT}$, $V_{OUT\_TARGET}$, the current $I_{LED}$ through an LED string, and the output of the clock signal selector 708, all versus time. Before time T1', while $V_{OUT}$ has a steady value, the clock signal selector 708 outputs the first clock signal CLK1 (graph line 802). At about time T1', $V_{OUT}$ sags (graph line 804), causing $I_{LED}$ (graph line 806) to sag. However, at about time T1', the added components in FIG. 7 (702, 704, 706) will detect that the corresponding feedback voltage signal LED_FB$_X$ (not shown in FIG. 8) is in an under-regulated condition, thus asserting the UNDER_REG signal to the clock signal selector 708, thereby selecting the second clock signal CLK2 as the clock input for the up/down counter 508. The higher-rate second clock signal CLK2 is applied from about time T1' to about time T2', causing the up/down counter 508 to more rapidly provide incrementing values of the output count M to be applied to the DAC 510, thus causing $V_{OUT\_TARGET}$ (graph line 808) to begin increasing to force $V_{OUT}$ higher. When $V_{OUT}$ equals the target value $V_{OUT\_TARGET}$ eventually reached at time T2', the UNDER_REG signal to the clock signal selector 708 is reset, thereby selecting the first clock signal CLK1 as the clock input for the up/down counter 508 when $V_{OUT}$ again has a steady value.

Notably, the duration of the sag in the LED current $I_{LED}$ in the illustrated example is less than about 1 mS in duration, which generally would not be perceived as flicker by the human eye (as should be clear, the time scale of FIG. 8 differs from the time scale of FIG. 6).

To sum up, embodiments of this aspect of the present invention include circuits and methods that accomplish the following functions: (1) scanning the feedback voltage signals LED_FB$_1$-LED_FB$_N$ from the LED array 406 to detect any under-regulation condition (e.g., the LED feedback voltage signal is too low for the current level through the LED); when an under-regulation condition is detected, switching the DAC 510 to a faster increment rate by applying a higher frequency clock signal to the up/down counter 508; and, once all feedback voltage signals LED_FB$_1$-LED_FB$_N$ exceed the under-regulation threshold, switching back to a normal up/down counter 508 frequency (and hence a normal DAC update rate).

Regulating Under-Shoot/Over-Shoot Conditions

Another problem identified after careful consideration of certain operational conditions of a switched inductor-capacitor DC-to-DC power converter and control system has led to the understanding that when the target output voltage changes faster than the power converter's response time, large under-shoots/over-shoots in $V_{OUT}$ can occur due to open-loop conditions, making the system less efficient.

For example, the feedback voltage signals LED_FB$_1$-LED_FB$_N$ of the LED array 406 may indicate that $V_{OUT}$ needs to increase rapidly from a voltage V1 to a voltage V2. The feedback voltage signals thus cause $V_{OUT\_TARGET}$ to rapidly increment in step-wise fashion by action of the control circuit shown in FIG. 5. However, if the DC-DC power converter 402 is slower than the rate of changes to $V_{OUT\_TARGET}$, open-loop conditions can occur. In particular, when the difference (delta) between $V_{OUT\_TARGET}$ and $V_{OUT}$ is large, the output of the error amplifiers 502a, 502b is railed (i.e., has reached the maximum value possible for the error amplifier circuitry) and an open loop condition occurs. Large over-shoots/under-shoots in $V_{OUT}$ can be observed as the system returns to a closed loop condition.

Figure 9:
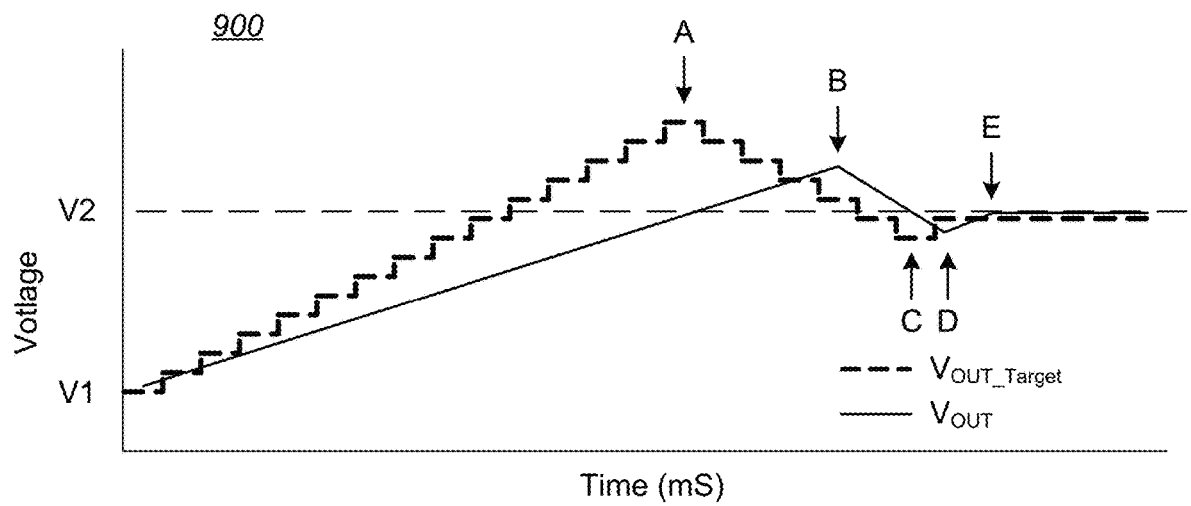
FIG. 9 is a graph of V$_{OUT\_TARGET}$ and V$_{OUT}$ versus time for one modeled embodiment of the LED array of FIG. 4 using a conventional switched inductor-capacitor DC-to-DC power converter and control system.

For example, FIG. 9 is a graph 900 of $V_{OUT\_TARGET}$ and $V_{OUT}$ versus time for one modeled embodiment of the LED array 406 of FIG. 4 using a conventional switched inductor-capacitor DC-to-DC power converter and control system. A feedback voltage signal LED_FB$_X$ from the LED array 406 indicates that $V_{OUT}$ needs to increase rapidly from voltage V1 to voltage V2. In this example, the DAC 510 will output $V_{OUT\_TARGET}$ in step-wise fashion to increment $V_{OUT}$. However, it takes time for the DC-DC power converter 402 to ramp $V_{OUT}$ up. Accordingly, $V_{OUT\_TARGET}$ will be further incremented, increasing the delta between $V_{OUT\_TARGET}$ and $V_{OUT}$. Eventually, $V_{OUT\_TARGET}$ is stepped up to Level A as the error amplifiers 502a, 502b are railed. However, owing to the lag time of the DC-DC power converter 402, it will respond to values of $V_{OUT\_TARGET}$ above V2, thus overshooting the desired V2 voltage level to Level B. When the feedback voltage signal LED_FB$_X$ indicates that $V_{OUT}$ exceeds V2, $V_{OUT\_TARGET}$ will be decremented to Level C, causing $V_{OUT}$ to under-shoot V2 down to Level D. As $V_{OUT\_TARGET}$ is again corrected by the feedback voltage signal LED_FB$_X$, $V_{OUT}$ settles to Level E, equal to the desired V2 voltage. Thus, $V_{OUT}$ "hunts" around V2 until eventually reaching the desired target voltage, which results in inefficiency for the power converter.

With this understanding of the characteristics of a conventional switched inductor-capacitor DC-to-DC power converter and control system, it was realized that the power converter controller could be improved so as to hold or reverse changes to $V_{OUT\_TARGET}$ to keep a closed loop condition for the system.

Figure 10:
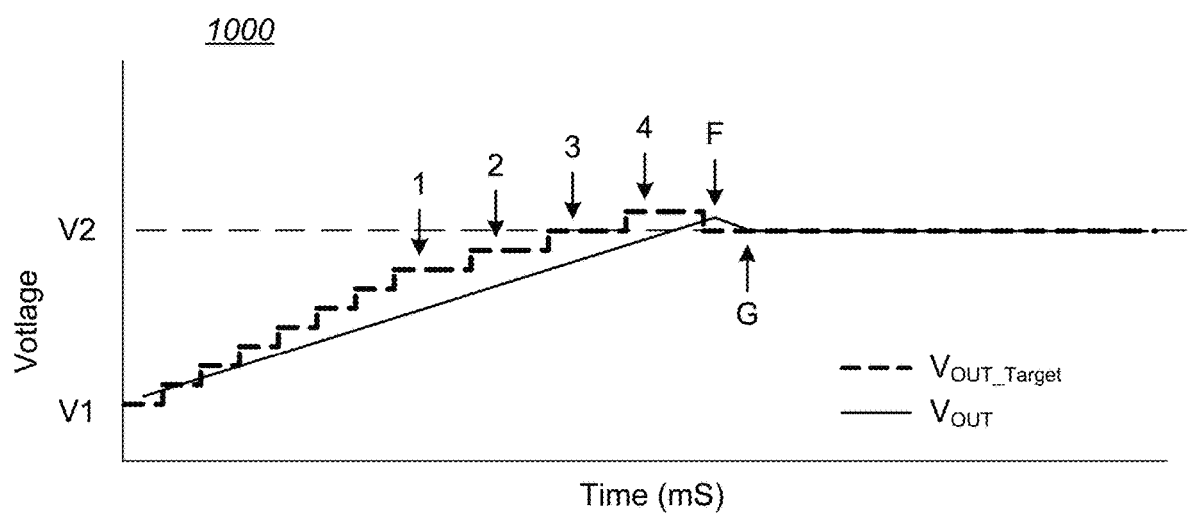
FIG. 10 is a graph of V$_{OUT\_TARGET}$ and V$_{OUT}$ versus time for one modeled embodiment of the LED array of FIG. 4 using an improved switched inductor-capacitor DC-to-DC power converter and control system in accordance with the present invention.

For example, FIG. 10 is a graph 1000 of $V_{OUT\_TARGET}$ and $V_{OUT}$ versus time for one modeled embodiment of the LED array 406 of FIG. 4 using an improved switched inductor-capacitor DC-to-DC power converter and control system in accordance with the present invention. A feedback voltage signal LED_FB$_X$ from the LED array 406 indicates that $V_{OUT}$ needs to increase rapidly from voltage V1 to voltage V2. The DAC 510 will output $V_{OUT\_TARGET}$ in step-wise fashion to increment $V_{OUT}$. As $V_{OUT\_TARGET}$ is incremented, the delta between $V_{OUT\_TARGET}$ and $V_{OUT}$ will increase. However, by monitoring $V_{OUT\_TARGET}$ and $V_{OUT}$ to determine if the delta exceeds a desired positive threshold, increments in $V_{OUT\_TARGET}$ can be suppressed (overridden) at points 1, 2, 3, and 4, thus reducing the delta between $V_{OUT\_TARGET}$ and the lagging $V_{OUT}$. The override of an undesired increment may be, for example, by causing a counter to decrement. Thus, in this example, $V_{OUT}$ overshoots V2 only slightly to Level F, and accordingly can be quickly corrected back to Level G, which equals V2. Similarly, if the delta exceeds a desired negative threshold, decrements in $V_{OUT\_TARGET}$ can be suppressed (overridden), thus reducing the delta between $V_{OUT\_TARGET}$ and the lagging $V_{OUT}$. The override of an undesired decrement may be, for example, by causing a counter to increment. The lessened over-shoot and under-shoot of $V_{OUT}$ combined with the faster correction time results in a more efficient DC-to-DC power converter and control system. More specifically, the load current $I_{LOAD}$ is more accurately maintained, and the entire circuit exhibits less power loss compared to conventional circuits.

Figure 3:
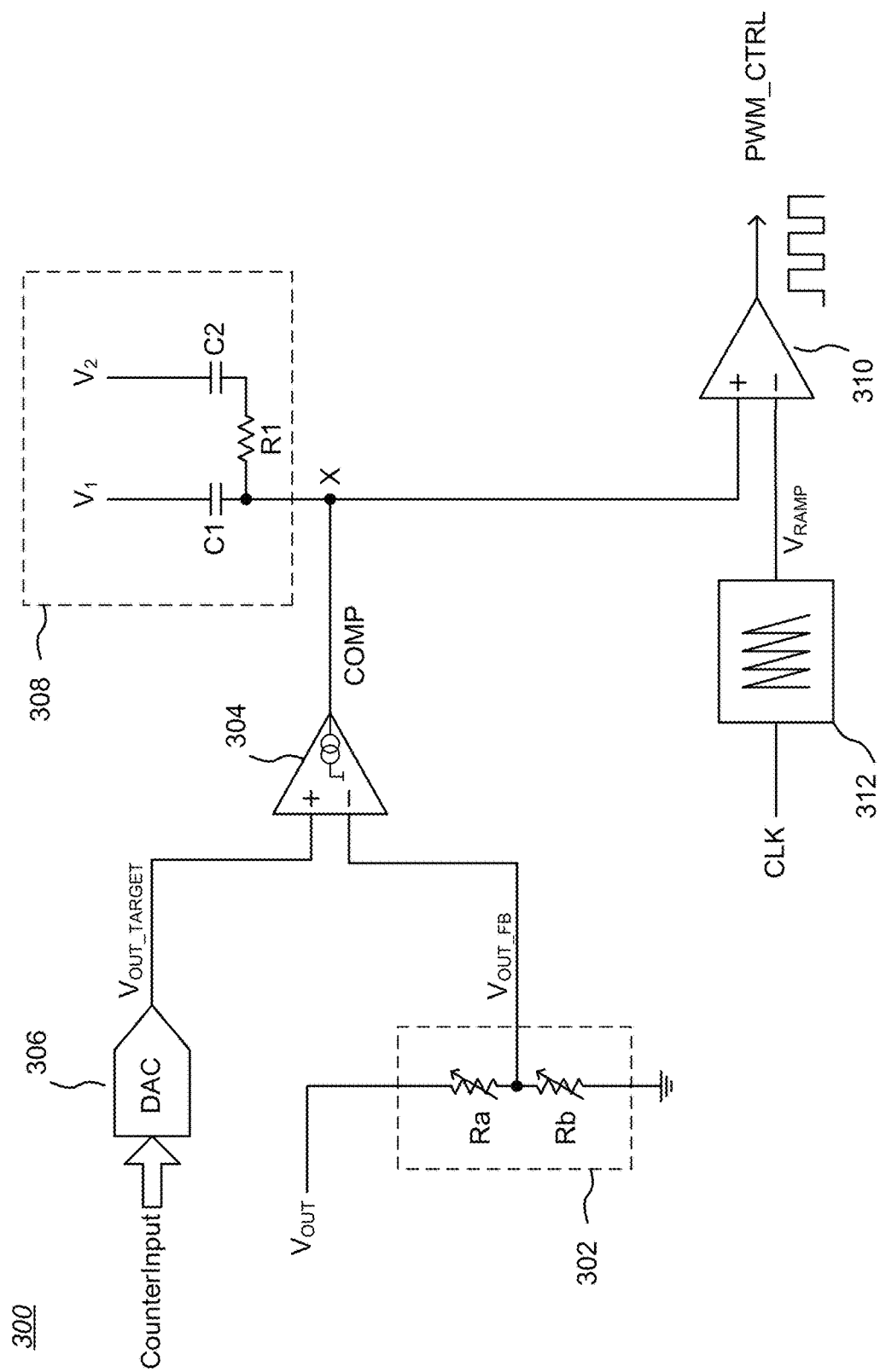
FIG. 3 is a schematic diagram of one prior art PWM duty cycle controller which may be used in the circuit of FIG. 2.
Figure 11:
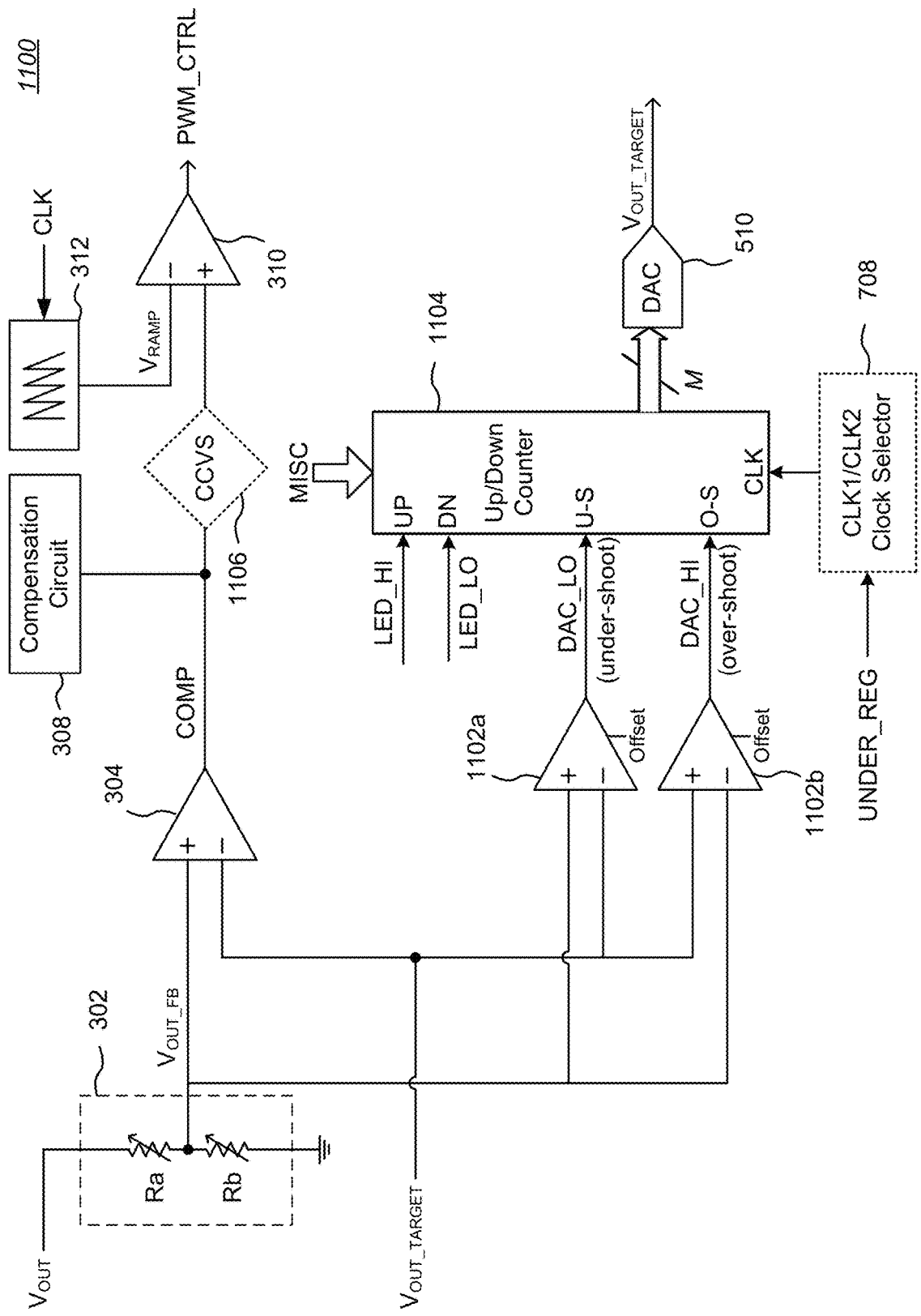
FIG. 11 is a block diagram of one embodiment of an improved power converter control circuit in accordance with the present invention.

FIG. 11 is a block diagram of one embodiment of an improved power converter control circuit 1100 in accordance with the present invention. The improved control circuit 1100 may be used, for example, to control the DC-DC power converter 402 in FIG. 4. Similar in some aspects to the circuit shown in FIG. 3, the circuit illustrated in FIG. 11 includes additional components to realize a novel solution. More specifically, the feedback voltage $V_{OUT}$_FB from the scaling circuit 302, proportional to $V_{OUT}$, is coupled to a first input of first and second window comparators 1102a, 1102b. A second input of the first and second window comparators 1102a, 1102b is coupled to $V_{OUT\_TARGET}$ (which is the desired value that $V_{OUT}$ should attain). A characteristic of the first and second window comparators 1102a, 1102b is that they have a programmable offset, so that a desired delta between the inputs can be programmably set for each window comparator 1102a, 1102b.

In the illustrated example, the offset for the first window comparator 1102a is set so that a negative delta between $V_{OUT\_TARGET}$ and $V_{OUT}$—indicating a tendency to under-shoot—triggers a DAC_LO output to an up/down counter 1104. The offset for the second window comparator 1102b is set so that a positive delta between $V_{OUT\_TARGET}$ and $V_{OUT}$—indicating a tendency to over-shoot—triggers a DAC_HI output to the up/down counter 1104.

The up/down counter 1104 accepts multiple inputs and allows logic combinations of those inputs to determine a value for an output count M. Other inputs to the up/down counter 1104 include LED_HI and LED_LO signals (e.g., from the circuit of FIG. 7), possible miscellaneous inputs MISC, and a CLK input. In some embodiments, the clock input CLK of the up/down counter 1104 may be coupled to a clock signal selector 708 controlled by an UNDER_REG signal, as in FIG. 7. The up/down counter 1104 uses the four inputs (DAC_HI, DAC_LO, LED_HI, LED_LO), and may use one or more miscellaneous inputs (e.g., fault conditions), to generate the M-bit output count.

Figure 12:
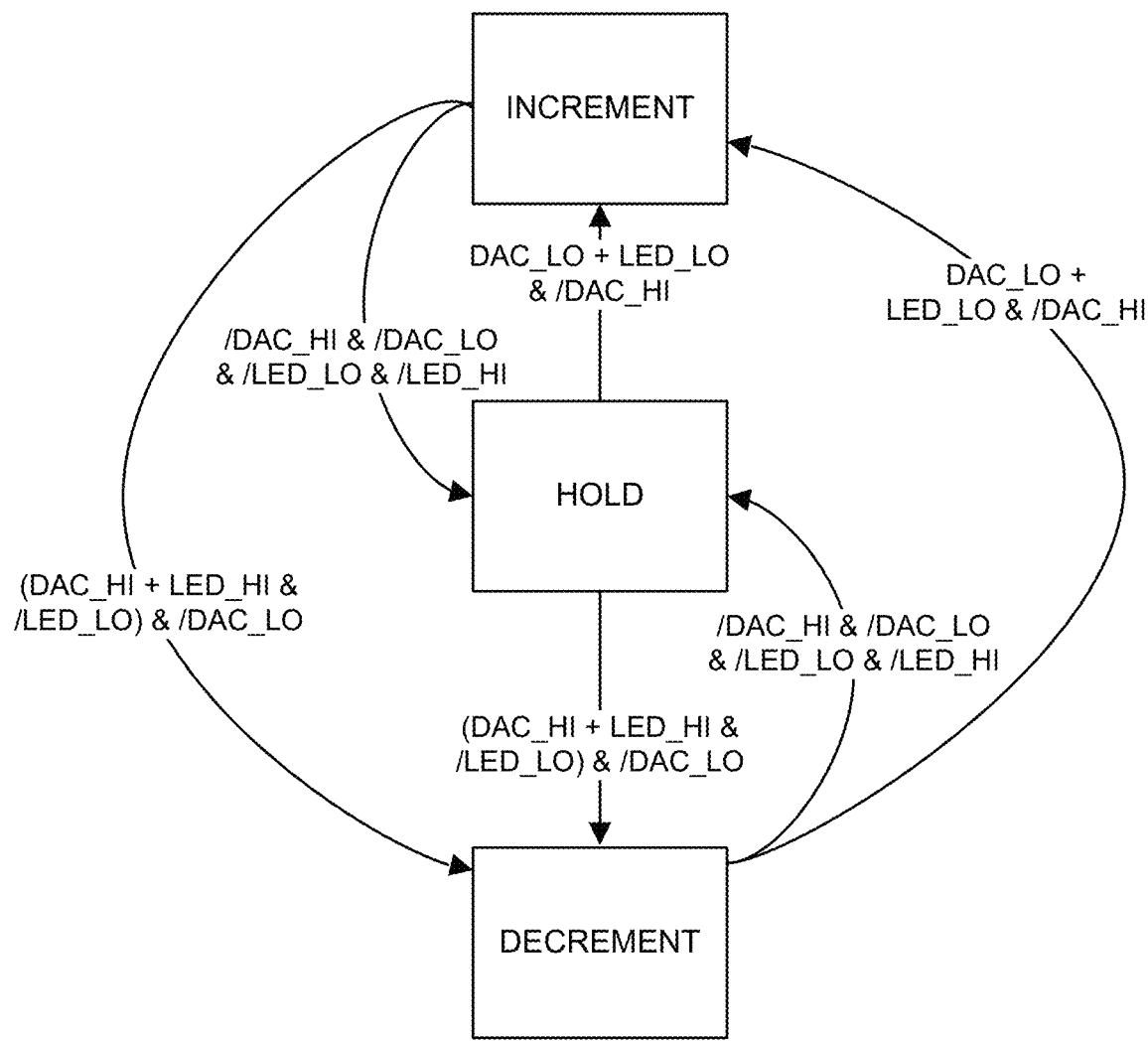
FIG. 12 is a state diagram showing one combination of inputs to the up/down counter of FIG. 11 that prevent a target voltage V$_{OUT\_TARGET}$ from deviating too far from the actual output voltage V$_{OUT}$ of a power converter.

For example, FIG. 12 is a state diagram 1200 showing one combination of inputs to the up/down counter 1104 of FIG. 11 that prevent a target voltage $V_{OUT\_TARGET}$ from deviating too far from the actual output voltage $V_{OUT}$ of a power converter. The symbol "+" represents a bitwise logic OR operation, the symbol "&" represents a bitwise logic AND operation, and the symbol "/" (a slash) represents a logic NOT (inversion) operation. The HOLD state indicates that $V_{OUT\_TARGET}$ should not be incremented or decremented. The INCREMENT state indicates that $V_{OUT\_TARGET}$ should be incremented, and the DECREMENT state indicates that $V_{OUT\_TARGET}$ should be decremented.

Under normal conditions, DAC_HI and DAC_LO will be low, and thus not affect incrementing/decrementing of $V_{OUT\_TARGET}$ by the LED_LO and LED_HI signals. However, the new signals DAC_HI and DAC_LO are given priority over the conventional LED_LO and LED_HI signals. Thus, for example, if the up/down counter 1104 is in the HOLD state, and DAC_LO is asserted, the up/down counter 1104 will transition to the INCREMENT state regardless of the state of LED_LO, owing to the combination [DAC_LO+LED_LO & /DAC_HI]. It is possible to use combinations of DAC_HI, DAC_LO, LED_HI, and LED_LO in conjunction with other signals (e.g., enable and/or error signals) to define other states and pathways between states.

Accordingly, by adding window comparators coupled to the power converter output $V_{OUT}$ (or to a scaled version of $V_{OUT}$) and the target output $V_{OUT\_TARGET}$, the up/down counter 1104 of the power converter controller can hold or reverse changes to $V_{OUT\_TARGET}$ to keep $V_{OUT\_TARGET}$ from deviating too far from $V_{OUT}$, thus maintaining a closed loop condition. Stated another way, preventing $V_{OUT\_TARGET}$ from deviating too far from $V_{OUT}$ substantially prevents open loop conditions that can cause large over-shoots and/or under-shoots.

Improved PWM Duty Cycle Controller

Figure 1:
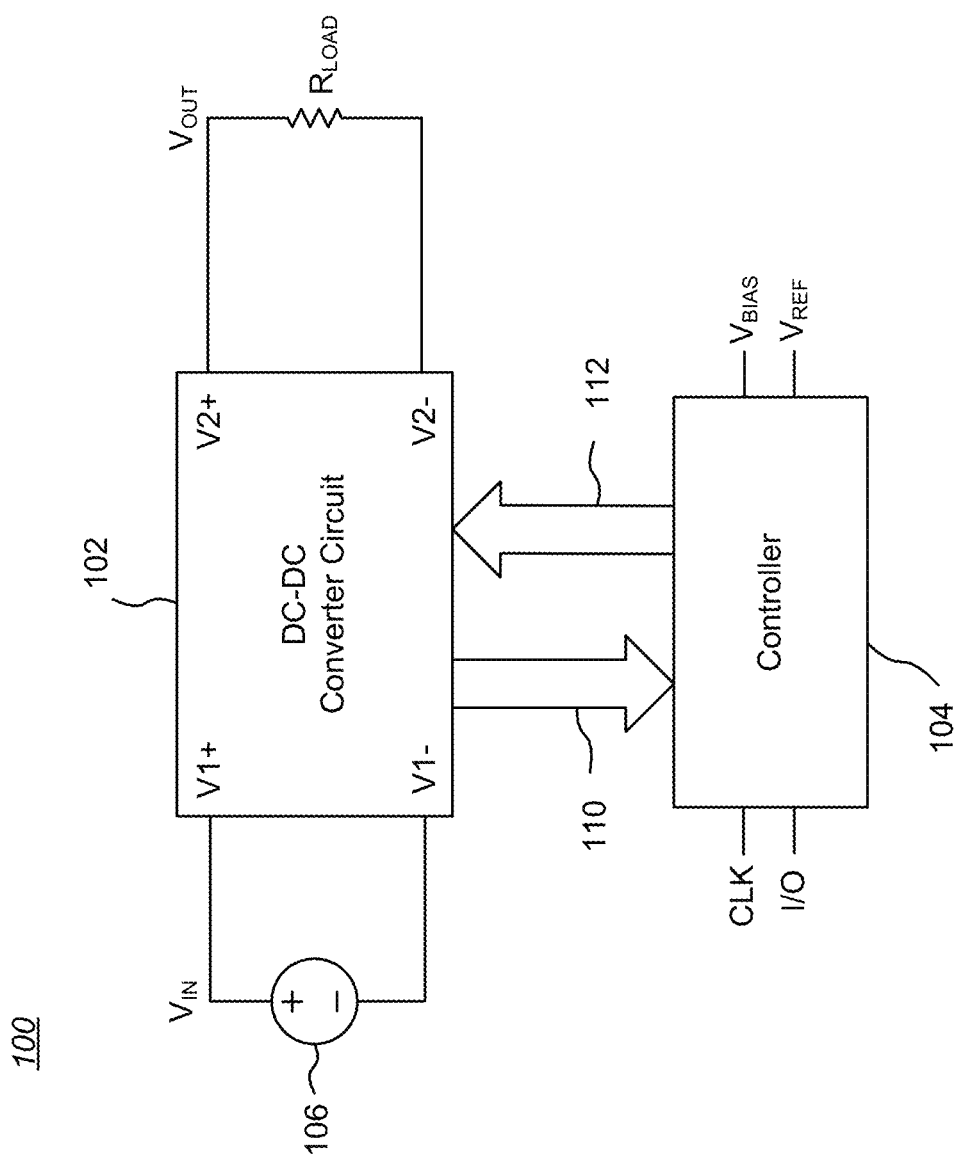
FIG. 1 is a block diagram showing a prior art DC-to-DC power converter.
Figure 2:
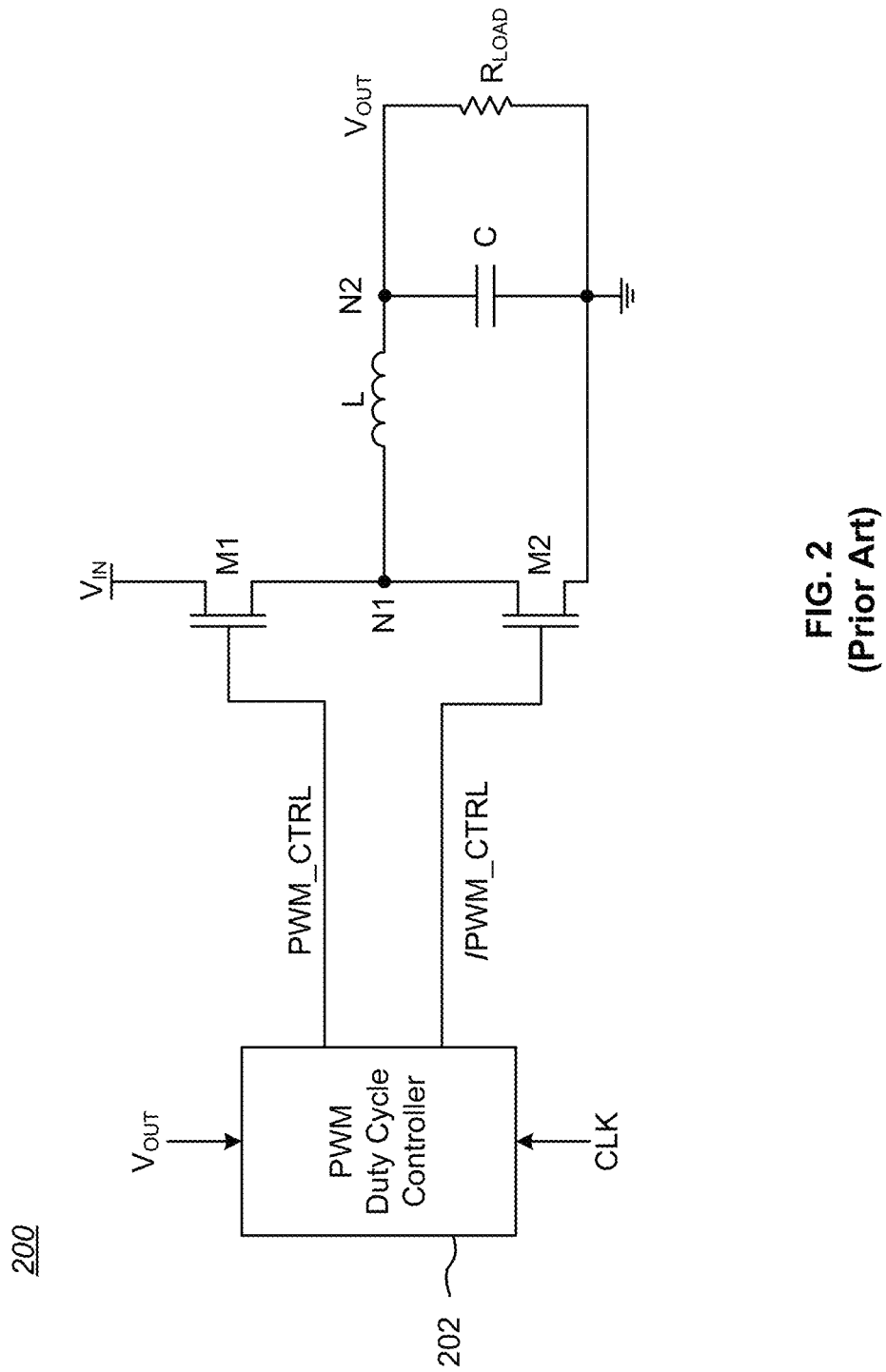
FIG. 2 is a schematic diagram of one prior art switched inductor-capacitor DC-to-DC power converter circuit.

Embodiments of the present invention may include an optional modification, shown in FIG. 11. As disclosed in detail in the U.S. Patent Application incorporated herein by the reference above, a current-controlled voltage source (CCVS) 1106 may be inserted between the error amplifier 304 and the comparator 310. As is known in the art, a CCVS outputs a voltage proportional to an applied current. The CCVS 1106 is preferably configured with an adjustable gain, thus allowing a selectable fraction of the current through the inductor L (see FIG. 2) to be converted to a voltage that adds to or subtracts from the integrated error signal, COMP, to generate a modified signal COMP_CM that is applied to the comparator 310. When the gain is set to zero, the PWM duty cycle controller 500 behaves like a standard Voltage Mode controller. When the gain is set to non-zero values, the PWM duty cycle controller 500 behaves like a hybrid of a Voltage Mode controller and a Current Mode controller.

By adding the voltage contribution from the CCVS 1106—indicative of the current through the inductor L—to the COMP error signal, the benefits of integrating feed-forward into the Voltage Mode $V_{RAMP}$ comparison can be combined with the simpler dynamic of sensing the inductor current. Thus, embodiments of the present invention that include the CCVS 1106 preserve the general benefits of a Voltage Mode controller, including better load step response than a pure Current Mode controller and operation at higher frequencies than a Current Mode controller (leading to faster response times to voltage and/or load variations), while eliminating or mitigating the disadvantages of a pure Voltage Mode controller with respect to stable operation in both constant current mode and discontinuous current mode. Other benefits of including the CCVS 1106 in the improved control circuit 1100 of FIG. 11 are described in the U.S. Patent Application incorporated herein by the reference above.

Methods

Figure 13:
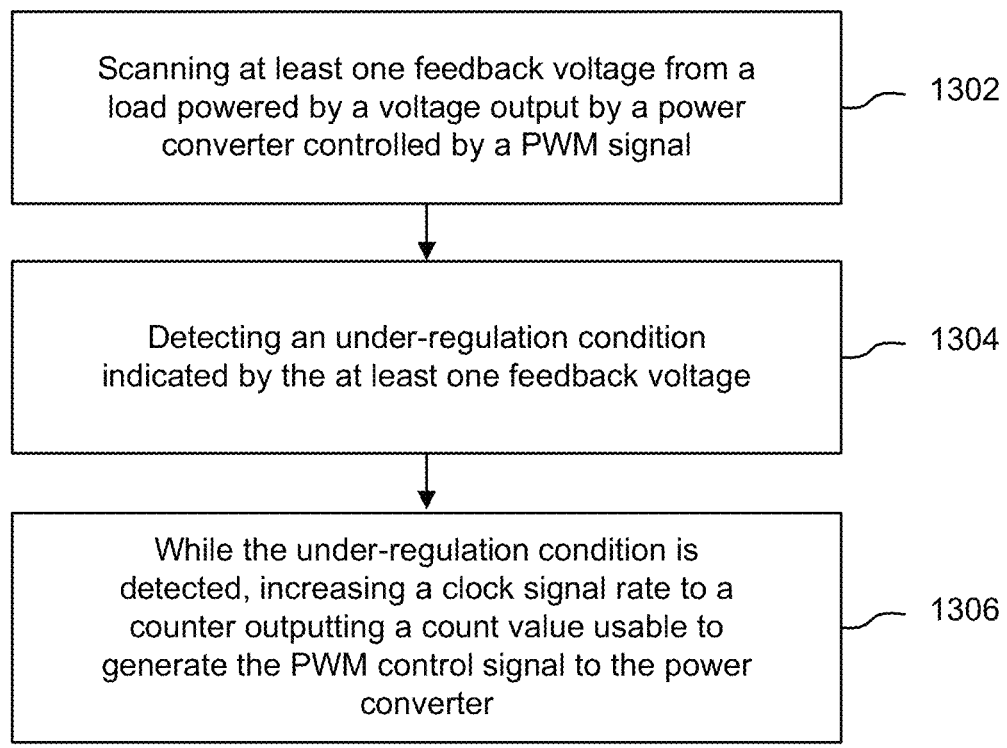
FIG. 13 is a process flow chart showing a first method for controlling a power converter controlled by a pulse-width modulation (PWM) control signal.

Another aspect of the invention includes methods for controlling a power converter controlled by a PWM control signal. As one example, FIG. 13 is a process flow chart 1300 showing a first method for controlling a power converter controlled by a pulse-width modulation (PWM) control signal. The method includes: scanning at least one feedback voltage from a load powered by a voltage output by a power converter controlled by a PWM signal (Block 1302); detecting an under-regulation condition indicated by the at least one feedback voltage (Block 1304); and while the under-regulation condition is detected, increasing a clock signal rate to a counter outputting a count value usable to generate the PWM control signal to the power converter (Block 1306).

Figure 14:
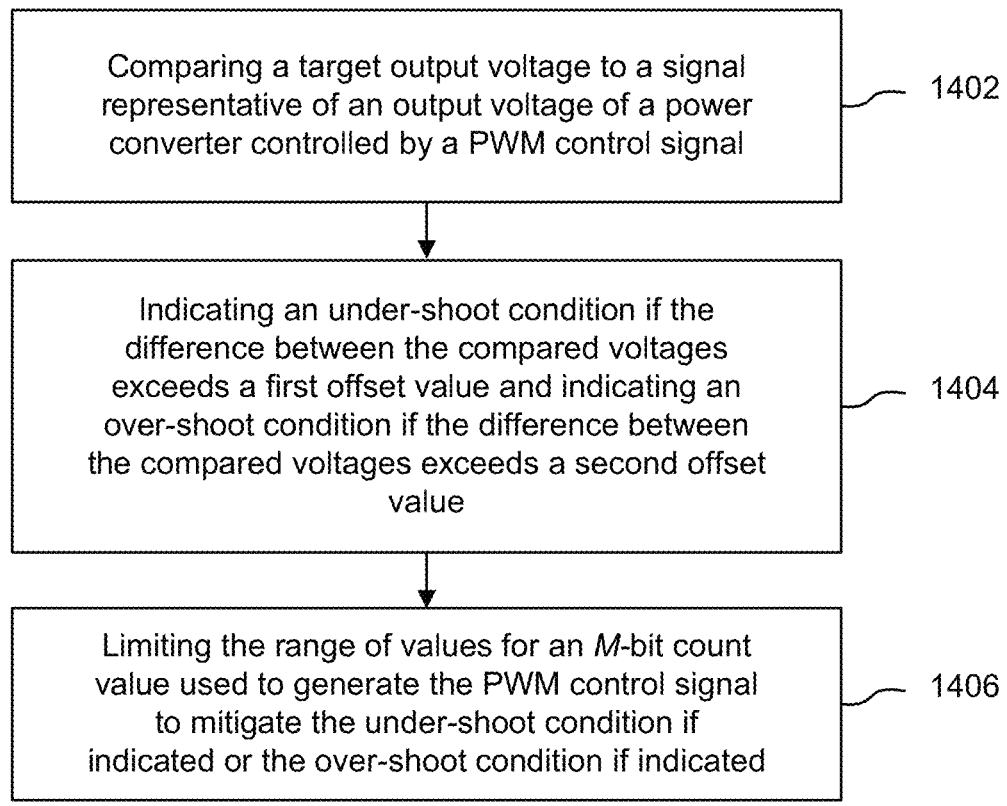
FIG. 14 is a process flow chart showing a second method for controlling a power converter controlled by a PWM control signal.

As another example, FIG. 14 is a process flow chart 1400 showing a second method for controlling a power converter controlled by a PWM control signal. The method includes: comparing a target output voltage to a signal representative of an output voltage of a power converter controlled by a PWM control signal (Block 1402); indicating an under-shoot condition if the difference between the compared voltages exceeds a first offset value and indicating an over-shoot condition if the difference between the compared voltages exceeds a second offset value (Block 1404); and limiting the range of values for an M-bit count value used to generate the PWM control signal to mitigate under-shoot condition if indicated or the over-shoot condition if indicated (Block 1406).

As should be clear, the above methods may be performed together in a single control for a power converter controlled by a PWM control signal.

ALTERNATIVE EMBODIMENTS, FABRICATION TECHNOLOGIES & OPTIONS

While the example above have used a pulse-width modulation (PWM) closed-loop controller as an example, circuits and methods embodying the inventions described herein may be readily adapted to other types of controllers. For example, a pulse-frequency modulation (PFM) close-looped controller may be used in conjunction with circuits such as those shown in FIGS. 7 and 11. PFM is a modulation method in which the width of square-wave pulses is fixed (rather than variable, as with PWM) while varying the frequency of the pulses. In other embodiments, a hysteretic controller or any generic controller that provides a controlling signal to a DC-DC converter circuit may be further regulated by circuits such as those shown in FIGS. 7 and 11.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A controller for a power converter controlled by a pulse-width modulation (PWM) control signal, the controller including:
   (a) a counter having a clock signal input, inputs for receiving signals corresponding to at least one feedback voltage and signals indicating a count direction, and an output for providing an M-bit count value in response to the received signals;
   (b) a digital-to-analog converter coupled to the output of the counter and outputting a signal corresponding to the provided M-bit count value to generate the PWM control signal;
   (c) a clock signal selector, coupled to the clock signal input of the counter and configured to be coupled to a first clock signal and to a second clock signal, the second clock signal having a higher frequency than the first clock signal; and
   (d) an under-regulation detector circuit, configured to be coupled to the at least one feedback voltage, the under-regulation detector circuit outputting an under-regulation signal to the clock signal selector if the at least one feedback voltage is less than an under-regulation reference voltage;
   wherein while the under-regulation detector circuit outputs the under-regulation signal, the clock signal selector couples the second clock signal to the clock signal input of the counter, and otherwise couples the first clock signal to the clock signal input of the counter.

2. The invention of claim 1, wherein the under-regulation detector circuit includes:
   (a) a comparator coupled to the under-regulation reference voltage and configured to be coupled to the at least one feedback voltage; and
   (b) a resettable latching circuit coupled between an output of the comparator and the clock signal selector.

3. The invention of claim 1, wherein the clock signal selector is integrated within the counter.

4. The invention of claim 1, further including:
   (a) a first detector circuit configured to be coupled to the at least one feedback voltage, the first detector circuit outputting a first control signal to the counter if the at least one feedback voltage is greater than a first reference voltage; and
   (b) a second detector circuit configured to be coupled to the at least one feedback voltage, the second detector circuit outputting a second control signal to the counter if the at least one feedback voltage is less than a second reference voltage.

5. The invention of claim 4, wherein the under-regulation reference voltage is less than the first reference voltage and the second reference voltage.

6. The invention of claim 4, wherein each of the first and second detector circuits includes:
   (a) a corresponding comparator coupled to a corresponding one of the first or second reference voltage and configured to be coupled to the at least one feedback voltage; and
   (b) a resettable latching circuit coupled between an output of the corresponding comparator and one of the inputs of the counter.

7. The invention of claim 1, wherein the counter includes an increment input for receiving an increment control signal based on the at least one feedback voltage, a decrement input for receiving a decrement control signal based on the at least one feedback voltage, an under-shoot input, an over-shoot input, the invention further including:
   (a) a first comparator including an output coupled to the under-shoot input of the counter, a first input coupled to the output of the digital-to-analog converter, and a second input configured to be coupled to a signal representative of to an output voltage of the power converter, the first comparator outputting a first control signal indicating an under-shoot condition if the difference between the first input and second input of the first comparator exceeds a first offset value; and
   (b) a second comparator including an output coupled to the over-shoot input of the counter, a first input coupled to the output of the digital-to-analog converter, and a second input configured to be coupled to a signal representative of an output voltage of the power converter, the second comparator outputting a second control signal indicating an over-shoot condition if the difference between the first input and second input of the second comparator exceeds a second offset value;
   wherein receipt of the first control signal or the second control signal causes the counter to limit the range of values for the M-bit count value to mitigate the corresponding under-shoot condition or over-shoot condition.

8. A power converter including:
   (a) a DC-to-DC converter circuit having an input for receiving an input voltage, and an output for outputting an output voltage different from the input voltage in response to a pulse-width modulated (PWM) control signal;
   (b) a PWM duty cycle controller coupled to the DC-to-DC converter circuit and configured to generate the PWM control signal to the DC-to-DC converter circuit from an M-bit count value;
   (c) a counter having a clock signal input, inputs for receiving signals corresponding to at least one feedback voltage and indicating a count direction, and an output providing the M-bit count value;
   (d) a digital-to-analog converter configured to output to the PWM duty cycle controller a signal corresponding to the provided M-bit count value from the counter;
   (e) a first detector configured to be coupled to the at least one feedback voltage, the first detector circuit outputting a first control signal to the counter if the at least one feedback voltage is greater than a first reference voltage;
   (f) a second detector circuit configured to be coupled to the at least one feedback voltage, the second detector circuit outputting a second control signal if the at least one feedback voltage is less than a second reference voltage;
   (g) a clock signal selector, coupled to the clock signal input of the counter and configured to be coupled to a first clock signal and to a second clock signal, the second clock signal having a higher frequency than the first clock signal; and
   (h) an under-regulation detector circuit, coupled to the clock signal selector, to an under-regulation reference voltage, and configured to be coupled to the at least one feedback voltage, the under-regulation detector circuit outputting an under-regulation signal to the clock signal selector if the at least one feedback voltage is less than the under-regulation reference voltage;
   wherein while the under-regulation detector circuit outputs the under-regulation signal, the clock signal selector couples the second clock signal to the clock signal input of the counter, and otherwise couples the first clock signal to the clock signal input of the counter.

9. The invention of claim 8, wherein the under-regulation detector circuit includes:
   (a) a comparator coupled to the under-regulation reference voltage and configured to be coupled to the at least one feedback voltage; and
   (b) a resettable latching circuit coupled between an output of the comparator and the clock signal selector.

10. The invention of claim 8, wherein each of the first and second detector circuits includes:
    (a) a corresponding comparator coupled to a corresponding one of the first or second reference voltage and configured to be coupled to the at least one feedback voltage; and
    (b) a resettable latching circuit coupled between an output of the corresponding comparator and one of the inputs of the counter.

11. The invention of claim 8, wherein the clock signal selector is integrated within the counter.

12. The invention of claim 8, wherein the under-regulation reference voltage is less than the first reference voltage and the second reference voltage.

13. The invention of claim 8, wherein the feedback voltage is from an LED array coupled to the output voltage of the DC-to-DC converter circuit.

14. A method for minimizing a duration of an under-regulation condition of a power converter controlled by a pulse-width modulation (PWM) control signal, the method including:
   (a) scanning at least one feedback voltage from a load powered by the power converter;
   (b) generating up and down count direction signals as a function of the at least one feedback voltage;
   (c) providing the up and down count direction signals as inputs to a counter configured to output an M-bit digital count value in response to the provided up and down count direction signals and to a first clock signal having a first frequency;
   (d) converting the M-bit digital count value to an analog signal;
   (e) generating the PWM control signal in response to the analog signal;
   (f) detecting an under-regulation condition indicated by the at least one feedback voltage;
   (g) while the under-regulation condition is detected, coupling a second clock signal to the counter in place of the first clock signal, the second clock signal having a second frequency higher than the first frequency.

15. The method of claim 14, wherein detecting the under-regulation condition includes:
   (a) comparing an under-regulation reference voltage to the at least one feedback voltage; and
   (b) asserting the under-regulation condition if the at least one feedback voltage is less than the under-regulation reference voltage.

16. The method of claim 14, wherein the counter includes an integrated clock signal selector configured to select the first clock signal in the absence of the assertion of the under-regulation condition, and to select the second clock signal upon the assertion of the under-regulation condition.

17. The method of claim 14, wherein generating the up and down count direction signals includes:
   (a) outputting the up count direction signal to the counter if the at least one feedback voltage is greater than a first reference voltage; and
   (b) outputting the down count direction signal to the counter if the at least one feedback voltage is less than a second reference voltage.

18. The method of claim 17, wherein the under-regulation condition is detected when the at least one feedback voltage is less than an under-regulation reference voltage, and wherein the under-regulation reference voltage is less than the first reference voltage and the second reference voltage.

19. The method of claim 17, wherein:
   (a) outputting the first control signal includes:
      (1) comparing the at least one feedback voltage to the first reference voltage; and
      (2) setting an output of a first latch to reflect the comparison if the at least one feedback voltage is greater than the first reference voltage, wherein the output of the set first latch is the up count direction signal; and
   (b) outputting the second control signal includes:
      (1) comparing the at least one feedback voltage to the second reference voltage; and
      (2) setting an output of a second latch to reflect the comparison if the at least one feedback voltage is less than the second reference voltage, wherein the output of the set second latch is the down count direction signal.

20. The method of claim 14, wherein the counter includes an increment input for receiving an increment control signal based on the at least one feedback voltage, a decrement input for receiving a decrement control signal based on the at least one feedback voltage, an under-shoot input, an over-shoot input, the method further including:
   (a) outputting an under-shoot condition control signal to the under-shoot input of the counter if a first difference between the analog signal and a signal representative of an output voltage of the power converter exceeds a first offset value;
   (b) outputting an over-shoot condition control signal to the over-shoot input of the counter if a second difference between the analog signal and the signal representative of an output voltage of the power converter exceeds a second offset value; and
   (c) limiting the range of values for the M-bit digital count value in response to receipt of the under-shoot condition control signal or the over-shoot condition control signal.

* * * * *